METHOD OF APPLYING AN OHMIC CONTACT TO SILICON OF HIGH RESISTIVITY
Filed Jan. 21, 1965
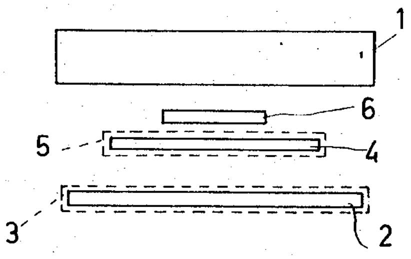
INVENTOR.
MICHEL BRUNET
BY
Frank R. Trifari
AGENT United States Patent Office 3,368,274

Patented Feb. 13, 1968

3,368,274

METHOD OF APPLYING AN OHMIC CONTACT TO SILICON OF HIGH RESISTIVITY

Michel Brunet, Caen, France, assignor to North American Philips Company, Inc., New York, N.Y., a corporation of Delaware Filed Jan. 21, 1965, Ser. No. 427,028
Claims priority, application France, Jan. 24, 1964, 961,502
4 Claims. (Cl. 29—589)

ABSTRACT OF THE DISCLOSURE

A method of making an ohmic connection to high resistivity silicon by fusing to the silicon constituents forming a quaternary alloy of gold, lead, tin, and nickel which bonds to the silicon or can be used to bond a conductor to the silicon.

The invention relates to a method of applying an ohmic contact to silicon, particularly to silicon of high resistivity, employed in the construction of semiconductor devices. Under "high resistivity" there is to be understood herein a resistance exceeding 50 ohm-cm.

With some devices of this kind, particularly with nuclear energy detectors and with some solar cells, it is necessary to use silicon of a high resistivity, for example of 1000 ohm-cm. with a correspondingly low doping of $10^{13}$ atoms/cm.$^3$ (for example boron atoms for obtaining p-type conductivity). With silicon of this degree of purity it is very difficult to apply an ohmic contact, since the surface is almost always covered with a thin oxide layer. If, for example, a nickel contact is applied to silicon of this quality by means of a selective area electrodeposition process known under the name of the Dalic method (see "Electroplating," April 1953, p. 131; "Electroplating and Metal Finishing," July 1964, pp. 246–8), the resultant contacts have an undesirable rectifying effect, although this method provides excellent results with silicon of a resistivity of 0.1 ohm-cm. and a doping concentration of $10^{17}$ atoms/cm.$^3$ Various methods have been proposed to obviate this disadvantage. The Austrian patent application No. 3,455/59 of May 8, 1959, proposes to obtain a contact by alloyoing the silicon with a metal to which boron and a very small quantity of gallium or indium are added. This method, rowever, does not yield useful results.

The United States Patent No. 3,021,595 of February 20, 1962, proposes to dip the silicon in an alloy of 40% by weight of gold, 55% by weight of lead and 5% by weight of indium, to which traces of an element are added which can effect the conductivity type near the contact. (for example antimony or arsenic). However, this method requires a temperature of at least 684° C., which comparatively high temperature is likely to reduce considerably the lifetime of the minority carriers in the silicon.

A method of applying a satisfactory ohmic contact to silicon of high resistivity according to the invention consists in the use of a quaternary alloy of gold, lead, tin and nickel between the metal concerned and the silicon. This alloy has alow resistivity and the final contact is characterized by the absence of any rectifying effect. It may be used for interconnecting the silicon on the one hand and a metal current supply conductor on the other hand.

The invention will be described more fully with reference to the accompanying drawing.

The figure shows the various elements used in this method. According to the invention a lead plate 4 with 3% of tin is arranged between the silicon body 1 and the current supply conductor 2 of any metal, preferably molybdenum or tungsten having a gold coating 3, said plate 4 being coated with a nickel layer 5 obtained by the above-mentioned Dalic method, which is characterized by the electrolyte being supported within a pad which is pressed against the article and the use of high current densities. A gold plate 6 doped with a donor element for obtaining the same conductivity type as that of the silicon body is applied intimately to the body.

The said parts are pressed together by a pressure varying between 100 and 1000 gs./cm.$^2$, which value is not very critical. The assembly is sintered at the same time for a few minutes at 530° C. in a reducing atmosphere, after which it is cooled slowly.

During the sintering process the lead with the 3% of tin melts as soon as a temperature of 327° C. is reached, at which the nickel from the surface is absorbed. The lead-tin-nickel eutectic thus formed dissolves the gold, with which it forms a new eutectic, which adheres directly to the silicon.

In this quaternary alloy the lead-tin reduces the melting temperature of all eutectics formed one after the other, while the nickel establishes the connection between the lead-tin on the one hand and the gold on the other hand, since these two metals do not adhere directly. Moreover, the simultaneous presence of nickel and gold provides for the final eutectic an expansion coefficient which matches that of silicon, so that a connection without cracks is obtained.

The gold plate for obtaining the contact on the silicon must be doped with a doping material providing the same conductivity type as that of the silicon body in order to obtain an ohmic junction.

The gold can be applied readily by electrolysis to the current supply conductor and nickel can readily be deposited on the lead with 3% of tin by the Dalic method.

If for example a contact is to be provided on p-type silicon of a resistivity of 1000 ohm-cm. with boron doping, the material of the current conductor may be nickel-iron of a thickness of 125$\mu$, to which a gold layer of 10$\mu$ or less can be applied by a known electrolytic method. After degreasing, the lead plate with 3% of tin is covered with a nickel layer of a thickness of less than 5$\mu$ by the Dalic method. According to the invention a gold plate of 50$\mu$ with a boron doping of 1% is arranged between the lead plate with tin and the silicon crystal.

The assembly is compressed by a pressure of for example 500 gs./cm.$^2$, after which it is introduced into a furnace filled with a mixture of 5 parts by volume of oxygen and 2 parts by volume of nitrogen. It is heated therein for about 5 minutes at a temperature of 530° C., after which it is cooled slowly to room temperature during about one hour.

Variants of this method are, of course, possible within the scope of this invention and particularly various technical means may be replaced by equivalent ones.

What is claimed is:

1. A method of making an ohmic contact between a current-supply conductor and silicon of high-resistivity exceeding 50 ohm-cm., comprising the steps of placing in contact with one another a current-supply conductor, a lead-tin-nickel member, a gold member, and the silicon, and heating said assembly at a temperature wherein the contacting constituents fuse to form a quaternary alloy of gold, lead, tin, and nickel bonding the silicon to the said conductor.

2. A method of making an ohmic contact between a current-supply conductor and silicon of high-resistivity exceeding 50 ohm-cm, comprising the steps of stacking together and in contact with one another in the order named a current-supply conductor having a gold coating thereon, a lead-tin member coated with nickel, a gold member doped with an active impurity producing the same conductivity type when incorporated in silicon as that of the silicon portion contacted by the gold member, and the silicon, and heating said stacked assembly at a temperature wherein the contacting constituents fuse to form a quaternary alloy of gold, lead, tin, and nickel bonding the silicon to the said conductor.

3. A method as set forth in claim 2 wherein the gold coating has a thickness of not more than 10 microns, the nickel coating has a thickness less than 5 microns, and the tin content is about 3% of the lead-tin member.

4. A method as set forth in claim 2 wherein the silicon portion to be contacted is of p-type conductivity, and the active impurity incorporated in the gold member is boron with a content of about 1%.

References Cited

UNITED STATES PATENTS

| | | | |
|---|---|---|---|
| 2,922,092 | 1/1960 | Gazzara | 29—155.5 X |
| 3,228,104 | 1/1966 | Emeis | 29—472.9 X |
| 3,242,391 | 3/1966 | Gorman | 29—25.3 X |

WILLIAM I. BROOKS, *Primary Examiner.*